INVENTOR.
LEWIS F. MILLER
BY George O. Saile
ATTORNEY

United States Patent Office 3,429,040

Patented Feb. 25, 1969

3,429,040
METHOD OF JOINING A COMPONENT TO A SUBSTRATE

Lewis F. Miller, Wappingers Falls, N.Y., assignor to International Business Machines Corporation, Armonk, N.Y., a corporation of New York Filed June 18, 1965, Ser. No. 465,034

U.S. Cl. 29—626 14 Claims

Int. Cl. H05k *3/30, 1/04;* H01r *9/04*

ABSTRACT OF THE DISCLOSURE

The ductile contacts of a microminiature circuit element are joined to connecting areas at the surface of an insulating substrate. Regions immediately surrounding certain of the connecting areas are not wet by the contact material. When the contacts and connecting areas are heated to a temperature at which the contacts melt, the surface tension of the contact material is sufficient to prevent collapse of the circuit element and thereby positively space the element from the substrate until the contacts are fused to the connecting areas.

This invention relates to a method for positioning microminiature components in electrical contact with and otherwise spaced from its supporting dielectric substrate and the resulting microminiature circuit structure.

Integrated circuit devices, whether individual active devices, individual passive devices, multiple active devices within a single chip, or multiple passive and active devices within a single chip, require suitable input/output connections between themselves and other circuit elements or structures. These devices are typically very small, for example in the order of square mils, and fragile. Because of their size and fragility they are commonly carried on substrates for support. Interconnection of these devices to the substrate is a particular problem. A number of interconnection requirements must be fulfilled before the resultant connection is acceptable. Thermal bonding processes which are widely employed to make electrical contact to semiconductor devices fail to meet one or more of these criteria. One criterion is that the interconnection must have sufficient strength to withstand normal shock and vibration associated with information handling systems. Another criterion is that the connecting material must not deteriorate or change electrical or mechanical characteristics when tested under extreme humidity or temperature conditions. Additionally, the interconnection must not short circuit the semiconductor. The interconnection should also have a melting point sufficiently high that it will not be affected during any soldering of the substrate to a supporting card. Finally, the connecting material should not produce a doping action on the active and passive chip devices with which the substrate is associated.

The use of a ductile solder pad to support chip devices has been proposed to reduce the transmission of thermal or mechanical stresses to the joint between the pad and the chip device. The ductile pad structure has proven unworkable until the present time because there was no apparent way of preventing the collapse of the pad structure during the heat-joining step and the resulting touching of the chip device to the supporting substrate. The touching of the chip device to the conductive electrodes directly causes electrical shorts and thereby the failure of the circuit structure.

It is therefore an object to provide a method for positioning microminiature components in electrical contact with and otherwise spaced from a supporting dielectric substrate with a ductile material.

It is another object of this invention to provide a method for positioning microminiature components in electrical contact with a supporting dielectric substrate and spacing the components from the substrate by limiting the solder-wettable area so as to permit the surface tension of the solder connection to be utilized to support the device during the period when the solder is fluid.

It is another object of this invention to provide a method for positioning microminiature components which permits self-alignment of misregistered devices due to surface tension phenomena.

It is another object of this invention to provide a microminiature circuit structure that utilizes only solder to make electrical contact with and space the microminiature components from the supporting dielectric substrate.

These and other objects are accomplished according to the broad aspects of the present invention by providing a method which utilizes surface tension to support the microminiature components during joining to a supporting structure. The dielectric supporting substrate is provided with an electrically conductive pattern having a plurality of connecting areas. The connecting areas are wettable with solder. The areas immediately surrounding the connecting areas, however, are not wettable by solder. A coating of solder is then applied to the size-limited connecting areas. A microminiature component which has solder contacts extending therefrom is then positioned on the preselected soldered connecting areas. The component contacts are gently pushed onto the solder to hold the component temporarily in place. The substrate holding the microminiature component is then heated to a temperature whereat the solder melts. The molten solder is maintained in substantially a ball shape because the areas immediately adjacent to the connecting areas are not wettable by the solder. The solder connection is then allowed to cool and the microminiature component is thereby electrically connected to the conductive pattern on the dielectric substrate and spaced from the substrate.

It has been observed that components thus positioned on the substrate that are misaligned when initially positioned on the solder coated connecting areas, are self-aligned when the solder is softened during the joining step. This advantage is also attributed to surface tension. The self-alignment feature greatly decreases the chances of inferior connections automatically and without an additional production step. Further, it can relax the stringent positioning requirements.

The foregoing and other objects, features and advantages of the invention will be apparent from the following more particular description of the preferred embodiments of the invention as illustrated in the accompanying drawings:

FIGURE 1 is a cutaway perspective view of a microminiature chip component to be fastened to a supporting substrate;

FIGURES 2*a*, *b* and *c* illustrate a first method embodiment for positioning microminiature components on a supporting dielectric substrate;

Figures 2A, 2B, 2C, 3, 6A, 6B, 6C, 7:
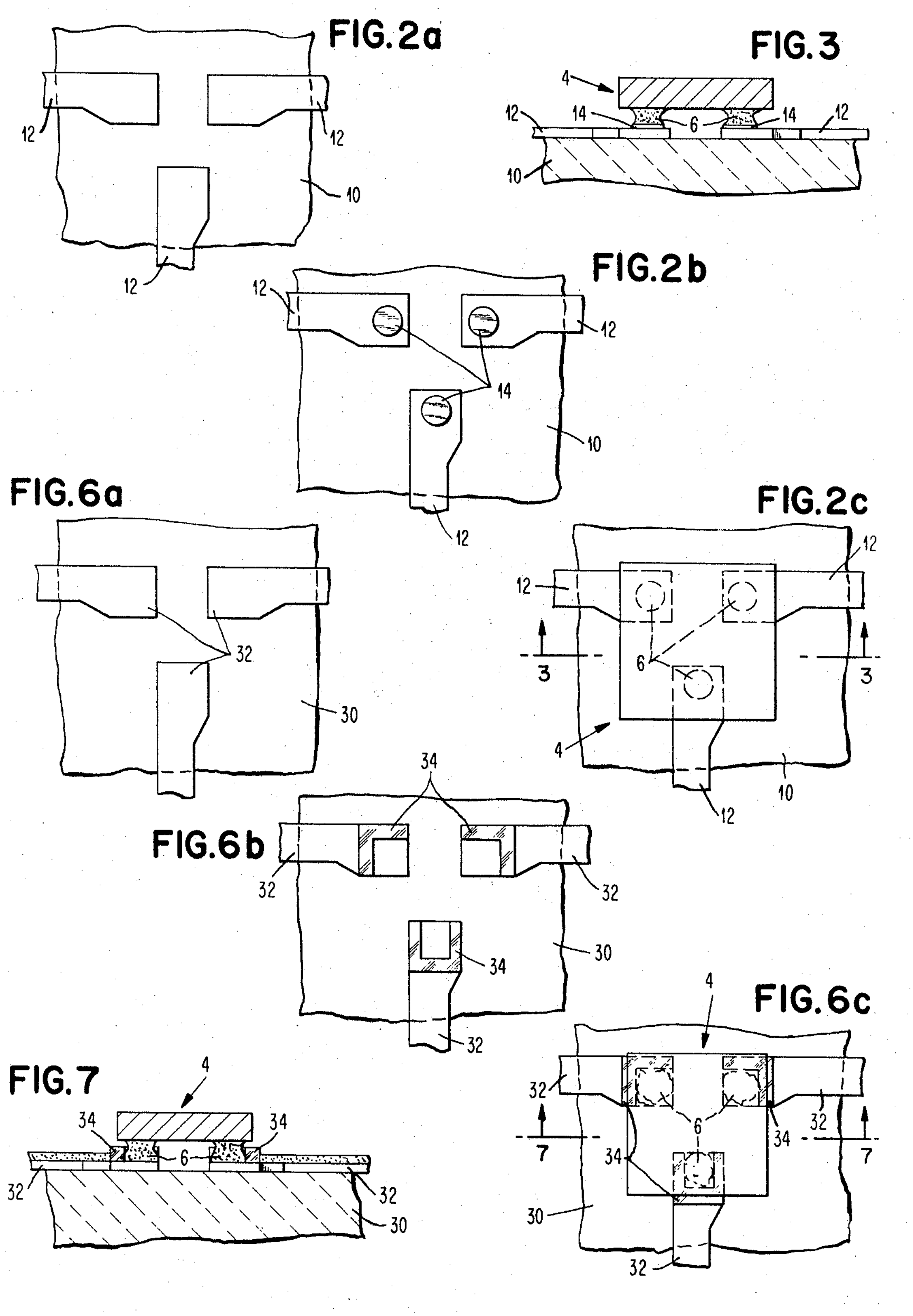
FIGURE 3 illustrates the microminiature circuit structure obtained from utilizing the method of FIGURES 2*a*, *b* and *c*.

FIGURES 6*a*, *b* and *c* illustrate a third method embodiment for positioning microminiature components on a supporting substrate; and FIGURE 7 illustrates the microminiature circuit structure obtained from the use of the FIGURE 6 method.

The microminiature components to be attached to the substrate may be active devices, passive devices or any combination of passive and active devices within a single chip. The only necessary requirement for the device is that it require electrical connection to a dielectric substrate.

Figure 1:
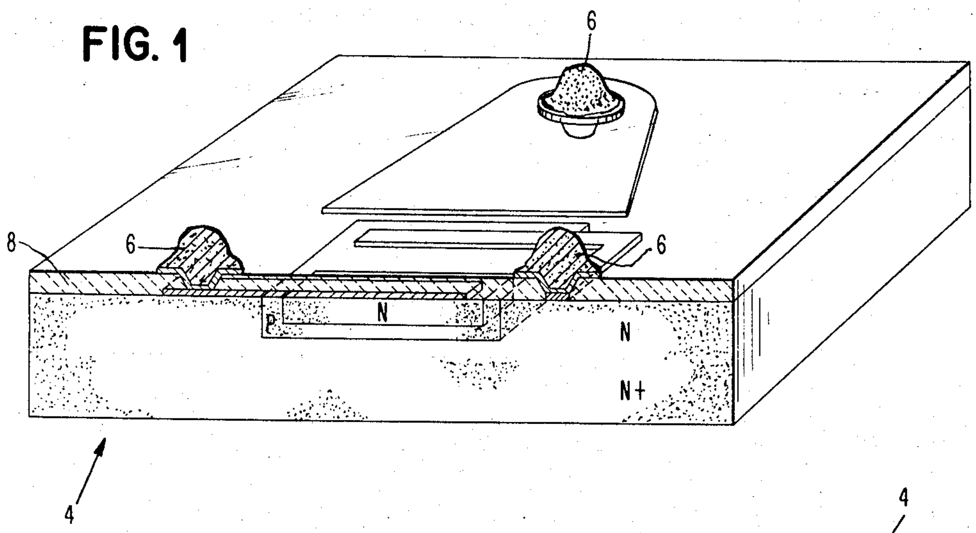

One active chip device which is usable is described in the article "Solid Logic Technology: Versatile, High-Performance Microelectronics" by E. M. Davis, W. E. Harding, R. S. Schwartz and J. J. Corning, published in the IBM Journal 1964. This active chip device will be hereinafter used for purpose of explanation of the present invention. The active chip component 4 shown in FIGURE 1 is a glass hermetically sealed component having solder ball contacts 6. Typically, the chip component is of the order of 25 mils by 25 mils square. The solder balls 6 are attached to the active semiconductor device through openings in the glass layer 8 covering the device. Before positioning the solder balls in the glass layer openings, a conductive metal film is deposited in the opening. The film has good adhesion to the glass underlying metal strips which connect to the semiconductor chip electrodes. After positioning the balls 6 in the opening the component is heated to join the balls and the metal film thereby establishing good electrical mechanical connection between the solder balls and the electrodes.

There are three basic method embodiments for positioning microminiature components in electrical contact with and otherwise spaced from a supporting dielectric substrate. The dielectric substrate can be composed of any of the common dielectric materials such as ceramics, glasses and plastics that can withstand the application of the conductive pattern thereto and the heat required in the solder joining step. Each of the methods has in common the fact that a connecting area is fabricated that is wettable with solder while the area immediately surrounding the connecting area is not wettable with solder. In this manner the spacing of the microminiature component from the substrate is effected.

Referring now to FIGURES 2*a*, *b* and *c* and FIGURE 3, the first method embodiment. An electrically conductive pattern 12 is applied to a dielectric substrate 10 and is subsequently dried and fired if required. The electrically conductive pattern is not wettable with solder. In FIGURE 2*b* a wettable with solder conducting connecting area in the form of dots 14 is applied to the conductive pattern by conventional printing techniques, such as silk screening. The dots are dried and fired, if required, at suitable temperatures. Solder is then applied to the connecting area. The solder application may be, for example, by dipping into a solder bath. The solder adheres to the connecting area dots 14 and not at all to the remaining portions of the conductive pattern. Rosin or other applicable flux is applied in solution to the soldered areas by conventional techniques, such as brushing, spraying or dipping. A microminiature component, such as the three ball active chip device 4 having the three solder balls 6 connected thereto is gently pushed into the flux covering the solder connecting areas 14 of the conductive pattern. The substrate 10 having the microminiature component chip temporarily attached to it is passed into an oven where the solder contacts and the connecting areas are heated to a temperature and for a time sufficient to soften the solder. The solder ball on the chip and the solder from the connecting area form a unified solder mass at this temperature. The solder maintains itself in substantially a ball on the dots 14 because of surface tension phenomena caused by the fact that the solder does not wet the conductive pattern 12. The component is thereby supported by the molten solder ball and spaced from the dielectric substrate 10. The temperature is reduced to room temperature and the solder solidifies. The resulting electrically connecting device is illustrated in FIGURE 3.

Figure 5:
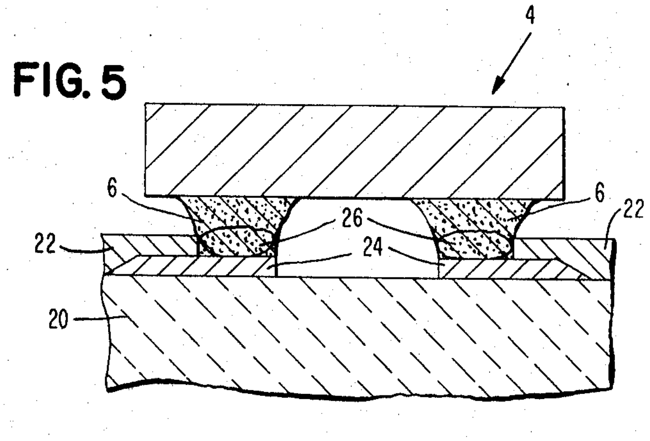
FIGURE 5 illustrates the microminiature circuit structure obtained from using the method of FIGURE 4.
Figure 4:
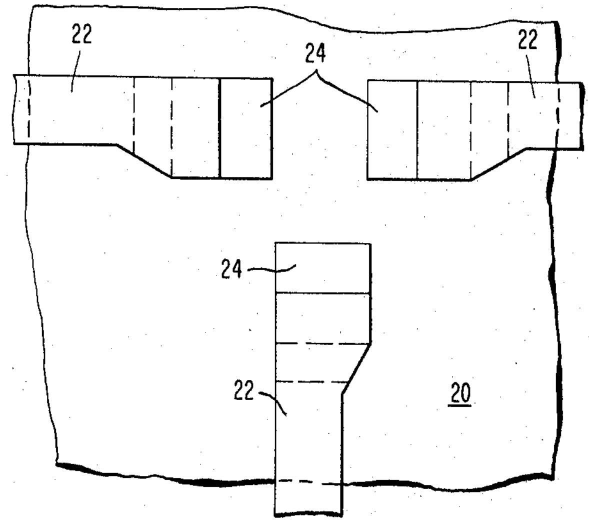
FIGURE 4 illustrates a second method embodiment for positioning microminiature components on a substrate.

Referring now to FIGURES 4 and 5 there is shown a second embodiment for attaching a microminiature component to a supporting substrate. The method of the second embodiment is similar to that of the first method, however, rather than applying solder wettable dots to the conductive pattern not wettable with solder, solder wettable connecting areas 24 are applied to the substrate 20 itself which are contiguous with the conductive pattern 22. The areas 24 are then dried and fired if required. Solder is then applied to the connecting areas 24 to form a coating 26. A solder flux is applied over the solder. A microminiature chip component 4 is positioned into the solder flux and the solder is softened in the heating oven as was described in the first method embodiment. The solder is then cooled to produce the microminiature circuit structure of FIGURE 5.

A third method embodiment is illustrated in FIGURES 6*a*, *b* and *c* and FIGURE 7 wherein a wettable with solder electrically conductive pattern having a plurality of connecting areas is screened on a supporting dielectric substrate 30. The pattern 32 is dried and fired if required. A pattern 34 of material is applied to the conductive pattern 32 that is not wettable with solder to make the areas immediately surrounding the connecting area not wettable with solder. This material does not have to be conductive and can be, for example, a glass frit, or a polymeric material or not wettable with solder metal. The material can be printed by any conventional technique in the desired pattern, dried and fired if necessary to produce a continuous coating that is not wettable with solder. A coating of solder is then applied to the solder wettable areas such as by dipping the substrate into a solder bath. A flux is applied over the solder. A microminiature component 4 having solder contacts 6 extending therefrom is positioned on a connecting area of the conductive pattern 32. The substrate, chip component and the connecting solder are heated in a manner as described in the other embodiments and the solder is subsequently cooled to provide the microminiature circuit structure of FIGURE 7.

The conductive materials used in the method embodiments are of two types, that is, one that is wettable with solder and the other that is not wettable with solder. A common requirement for both types is high conductivity because the printed conductors typically have a width of 5 to 15 mils or less and a thickness of 0.5 to 1.5 mils. The conductors are, therefore, preferably largely composed of single or combinations of noble metals such as gold, silver, platinum and palladium. One useful solder wettable conductive material is an alloy of silver and palladium such as described in the copending U.S. patent application Ser. No. 370,467, filed May 27, 1964, now Patent No. 3,374,110, of Lewis F. Miller entitled "Conductive Element and Method" and assigned to the same assignee as the present invention. The silver-palladium alloy has mixed with it small quantities of vitreous frit which acts to bond the metals to the substrate and to themselves. Another class of very useful conductive material is alloys of gold and platinum. There are, however, many other solder wettable conductive materials that can be successfully used. Useful non-wettable with solder conductive materials are disclosed in the copending U.S. patent application Ser. No 465,035, filed June 18, 1965, of Lewis F. Miller and Richard Spielberger entitled "Conductive Element" and assigned to the same assignee as the present invention, now U.S. Patent 3,401,126, issued Sept. 10, 1968. This solder nonwettable conductive material is composed of highly conductive noble metals or alloys having dispersed therein minor quantities of metal oxides having a melting point over 1000° C. and the characteristic of destroying the solder wettability of the metal without otherwise materially altering its properties. Another class of non-wettable with solder conductive materials are noble metal dispersions in a polymeric binder material.

A wide range of solders can be used as the ductile electrical connection and microminiature support. These solders include all binary alloys of lead and tin as well as other low melting alloys which may be combinations of indium, gallium, silver, gold, antimony, etc. However, the preferred solder composition is between about 5 to 40 percent by weight tin and 95 to 60 percent by weight lead. The softening temperature of this preferred solder composition is about 300° C. The solder joining of microminiature chip to the substrate for this preferred solder is between approximately 330° C. to 365° C.

The invention has been described with reference to a three contact active device. However, it will be understood by those skilled in the art that the invention is not so limited and other active, passive and combinations of active and passive devices having any number of solder contacts can be joined to a substrate in the manner described. Also, while the contacts are illustrated spherical in shape, it is obvious that other contact shapes are usable.

While the invention has been particularly shown and described with reference to the preferred embodiments thereof, it will be understood by those skilled in the art that various changes in form and detail may be made therein without departing from the spirit and scope of the invention.

What is claimed is:

1. A method for positioning microminiature components in electrical contact with and otherwise spaced from a supporting dielectric substrate comprising:
- providing an electrically conductive pattern having a plurality of connecting areas on a supporting dielectric substrate:
- said connecting areas being wettable with solder;
- the areas immediately surrounding the said connecting areas being not wettable by solder;
- applying a coating of solder to the said connecting areas;
- positioning a microminiature component having solder contacts extending therefrom onto preselected connecting areas of said conductive pattern; and
- heating the said solder contacts and said preselected connecting areas to a temperature and for time sufficient to soften the respective solder areas and to fuse the said component to the said substrate in spaced relation to said substrate, the surface tension of said solder during heating being sufficient to support said microminiature component from the surface of said substrate until said contacts are fused to said connecting areas.

2. A method for positioning microminiature components in electrical contact with and otherwise spaced from a supporting dielectric substrate comprising:
- applying an electrically conductive pattern onto a supporting dielectric substrate;
- providing wettable with solder connecting areas and the areas immediately surrounding the said connecting areas being not wettable by solder in said pattern;
- applying a coating of solder to the said connecting areas;
- positioning a microminiature component having solder contacts extending therefrom onto preselected connecting areas of said conductive pattern; and
- heating the said solder contacts and said preselected connecting areas to a temperature and for time sufficient to soften the respective solder areas and to fuse the said component to the said substrate in spaced relation to said substrate, the surface tension of said solder during heating being sufficient to support said microminiature component from the surface of said substrate until said contacts are fused to said connecting areas.

3. A method for positioning microminiature components in electrical contact with and otherwise spaced from a supporting dielectric substrate comprising:
- applying an electrically conductive pattern that is not wettable with solder on a supporting dielectric substrate;
- providing wettable with solder connecting areas in electrical contact with said pattern;

- applying a coating of solder to the said connecting areas;
- positioning a microminiature component having solder contacts extending therefrom onto preselected connecting areas of said conductive pattern; and
- heating the said solder contacts and said preselected connecting areas to a temperature and for time sufficient to soften the respective solder areas and to fuse the said component to the said substrate in spaced relation to said substrate, the surface tension of said solder during heating being sufficient to support said microminiature component from the surface of said substrate until said contacts are fused to said connecting areas.

4. The method of claim 3 wherein the said wettable with solder connecting areas are applied over the said pattern.

5. The method of claim 3 wherein the said wettable with solder connecting areas are applied to the said substrate and contiguous with the said pattern.

6. A method for positioning microminiature components in electrical contact with and otherwise spaced from a supporting dielectric substrate comprising:
- applying a wettable with solder, electrically conductive pattern having a plurality of connecting areas on a supporting dielectric substrate;
- applying a pattern of material to said conductive pattern that is not wettable with solder to make the areas immediately surrounding the said connecting areas not wettable by solder;
- applying a coating of solder to the said connecting areas;
- positioning a microminiature component having solder contacts extending therefrom onto preselected connecting areas of said conductive pattern; and
- heating the said solder contacts and said preselected connecting areas to a temperature and for time sufficient to soften the respective solder areas and to fuse the said component to the said substrate in spaced relation to said substrate, the surface tension of said solder during heating being sufficient to support said microminiature component from the surface of said substrate until said contacts are fused to said connecting areas.

7. The method of claim 6 wherein the said pattern of material applied to said conductive pattern is composed of finely divided glass particles and which is applied by silk screening and said glass particles are then fused together by raising the temperature of the particles above their softening point.

8. The method of claim 6 wherein the said pattern of material applied to said conductive pattern is not wettable with solder, is applied by silk screening and is fused into a continuous layer.

9. In the method of joining a microminiature component to a substrate, said component having a face with solder wettable portions, the face regions surrounding said solder wettable portions being non-wettable by solder, the improvement comprising:
- forming on said substrate a plurality of solder wettable areas, the regions surrounding said solder wettable areas being non-wettable by solder;
- providing solder connectors for joining said component to said substrate;
- positioning said component with respect to said substrate such that said solder connectors are interposed between the solder wettable portions of said component and solder wettable areas of said substrate;
- heating said solder connectors to a temperature and for a time sufficient to fuse said component to said substrate;
- the surface tension of said solder being sufficient during heating to support said component in spaced relationship from said substrate; and cooling, thereby establishing a unified joint by means of said solder connectors between the solder wettable portions of said component and the solder wettable areas of said substrate.

10. In the method of claim 9 the improvement wherein: said non-wettable regions are formed at least in part by applying a pattern of conductive material that is not wet by solder to said substrate in electrical contact with said solder wettable areas.

11. In the method of claim 10 the improvement wherein:

said non-wettable conductive pattern is applied contiguous with said solder wettable areas.

12. In the method of claim 10 the improvement wherein:

said solder wettable areas are applied to said non-wettable conductive pattern.

13. In the method of claim 9 the improvement comprising:

applying a pattern of conductive material that is wet by solder to said substrate in electrical contact with said solder wettable areas; and applying a pattern of material to said wettable conductive pattern that is not wettable by solder, forming at least a portion of said non-wettable regions.

14. In the method of claim 13 the improvement wherein:

said non-wettable material is glass.

References Cited

UNITED STATES PATENTS

| | | | |
|---|---|---|---|
| 2,721,822 | 10/1955 | Pritikin. | |
| 2,777,192 | 1/1957 | Albright et al. | 29—626 |
| 2,777,193 | 1/1957 | Albright et al. | 29—626 |
| 2,885,601 | 5/1959 | Pessel | 29—626 X |
| 3,052,957 | 9/1962 | Swanson | 29—626 |
| 3,152,388 | 10/1964 | Grossman | 29—626 |
| 3,189,978 | 6/1965 | Stetson. | |
| 3,239,719 | 3/1966 | Shower. | |
| 3,261,713 | 7/1966 | Groten | 117—212 |
| 3,266,125 | 8/1966 | Tobolski | 29—627 |
| 3,279,037 | 10/1966 | McVea | 29—628 |
| 3,075,281 | 1/1963 | Spooner | 29—155.55 |
| 3,103,067 | 9/1963 | Dixon | 29—473.1 |
| 3,107,414 | 10/1963 | Sterling | 29—155.5 |
| 3,303,393 | 2/1967 | Hymes | 317—101 |
| 3,307,246 | 3/1967 | Gulliksen et al. | |

FOREIGN PATENTS

| | | |
|---|---|---|
| 836,138 | 6/1960 | Great Britain. |

JOHN F. CAMPBELL, *Primary Examiner.*

D. C. REILEY, *Assistant Examiner.*

U.S. Cl. X.R.

29—501, 630; 174—68.5; 317—101